United States Patent
Schwamb et al.

(10) Patent No.: US 10,367,168 B2
(45) Date of Patent: Jul. 30, 2019

(54) ORGANIC OPTOELECTRONIC COMPONENT

(71) Applicant: OSRAM OLED GmbH, Regensburg (DE)

(72) Inventors: Philipp Schwamb, Regensburg (DE); Simon Schicktanz, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 15/967,120

(22) Filed: Apr. 30, 2018

(65) Prior Publication Data

US 2018/0342701 A1 Nov. 29, 2018

(30) Foreign Application Priority Data

May 26, 2017 (DE) .......... 10 2017 111 519

(51) Int. Cl.
*H01L 51/44* (2006.01)
*H01L 51/52* (2006.01)

(52) U.S. Cl.
CPC ........ *H01L 51/5259* (2013.01); *H01L 51/448* (2013.01); *H01L 51/5253* (2013.01)

(58) Field of Classification Search
CPC ....... H01L 23/26; H01L 23/28; H01L 23/564; H01L 51/448; H01L 51/5253; H01L 51/5259
See application file for complete search history.

(56) References Cited

U.S. PATENT DOCUMENTS

| | | | |
|---|---|---|---|
| 2006/0170341 A1* | 8/2006 | Su | H01L 51/5253 313/512 |
| 2015/0337174 A1 | 11/2015 | Keite-Telgenbüscher et al. | |
| 2017/0327717 A1 | 11/2017 | Schuh et al. | |

FOREIGN PATENT DOCUMENTS

| | | |
|---|---|---|
| DE | 102012224310 A1 | 6/2014 |
| EP | 1912732 B1 | 5/2012 |
| WO | 2016026685 A1 | 2/2016 |
| WO | 2016066435 A1 | 5/2016 |

* cited by examiner

*Primary Examiner* — Jasmine J Clark
(74) *Attorney, Agent, or Firm* — Slater Matsil, LLP

(57) ABSTRACT

An organic optoelectronic component is disclosed. In an embodiment, an organic optoelectronic component includes an organic layer sequence having an active layer for emitting or absorbing electromagnetic radiation, a thin-film encapsulation on the organic layer sequence, an absorption layer on the organic layer sequence, the absorption layer configured to absorb and store a substance which is harmful to the organic layer sequence and a transport layer directly adjacent to the absorption layer, the transport layer configured to transport the harmful substance, wherein the transport layer has a greater diffusion coefficient and/or a higher transmission rate for the harmful substance than the absorption layer, and wherein the absorption layer has a higher storage capacity for the harmful substance than the transport layer so that the harmful substance, upon contact with the transport layer, is distributed within the transport layer and is subsequently absorbed by the absorption layer.

20 Claims, 3 Drawing Sheets

ORGANIC OPTOELECTRONIC COMPONENT

CROSS-REFERENCE TO RELATED APPLICATIONS

This application claims the benefit of German patent application 10 2017 111 519.6, filed on May 26, 2017, which application is hereby incorporated herein by reference.

TECHNICAL FIELD

An organic optoelectronic component is provided.

SUMMARY

Embodiments provide an organic optoelectronic component having a long service life.

According to at least one embodiment, the organic optoelectronic component comprises an organic layer sequence having an active layer for emitting or absorbing electromagnetic radiation. The organic optoelectronic component is, for example, an organic light-emitting diode, OLED for short. The active layer is formed in particular from organic material. During normal operation, the active layer generates, for example, light in the visible spectral range, such as blue or green or red or yellow or white light. The organic layer sequence may be attached between two electrodes, via which the organic layer sequence is electrically contacted during operation.

According to at least one embodiment, the component comprises a thin-film encapsulation on the organic layer sequence. The thin-film encapsulation is preferably applied directly to one of the electrodes, i.e., is in direct mechanical contact with the electrode. The thin-film encapsulation serves as protection of the organic layer sequence and the electrodes from external influences, in particular from the penetration of substances harmful to the organic layer sequence or electrodes, such as moisture or water and/or oxygen. For example, the thin-film encapsulation is a layer of silicon oxide or silicon nitride or aluminum nitride, which can be produced on the organic layer sequence by chemical vapor deposition, CVD for short, or physical vapor deposition, PVD for short, or atomic layer deposition, ALD for short, or sputtering.

For example, the layer thickness of the thin-film encapsulation is at least 10 nm or at least 50 nm or at least 100 nm or at least 200 nm. As an alternative or in addition, the layer thickness of the thin-film encapsulation is at most 10000 nm or at most 1000 nm or at most 400 nm or at most 300 nm.

According to at least one embodiment, the component comprises an absorption layer on the organic layer sequence. The absorption layer is set up in such a way that it can absorb and permanently store a substance which is harmful to the organic layer sequence. Such an absorption layer is often also referred to as a getter layer. Absorption layers are often used in OLEDs, in particular for absorbing water and/or oxygen. They act like a sponge for the harmful substance and suck this harmful substance out of the component, for example, so that the harmful substance cannot get to the organic layer sequence or only to a slight extent. In other words, the absorption layer has a high storage capacity for the harmful substance.

The absorption layer may store the harmful substance without releasing it again to a significant extent. It can absorb the harmful substance until its storage capacity is depleted. Here and below, "storage" is understood in particular to mean a non-reversible absorption of the substance. The non-reversible absorption can be achieved in particular in that the absorption layer is designed in such a way that the harmful substance reacts chemically within the absorption layer and is converted into another substance.

The harmful substance can be water or oxygen or another substance, such as sulfur. A substance which is harmful to the organic layer sequence attacks the organic layer sequence and/or an electrode and ensures that the functional capability of the electrode or of the organic layer sequence, in particular of the active layer, is reduced or destroyed. This is noticeable, for example, in an OLED in that at points in which the harmful substance has reached the organic layer sequence, dark, non-luminous spots appear.

According to at least one embodiment, the component comprises a transport layer directly adjacent to the absorption layer. The absorption layer is preferably in contact with the transport layer along its entire lateral extent.

The transport layer may be set up for transporting or diffusing the harmful substance. This means that when the transport layer comes into contact with a certain amount of the harmful substance at one point, the harmful substance is absorbed by the transport layer and is transferred, transported or distributed within the transport layer. In particular, the harmful substance diffuses within the transport layer. The transport layer is preferably permeable or partially permeable to the harmful substance.

According to at least one embodiment, the transport layer has a greater diffusion coefficient and/or a higher transmission rate for the harmful substance than the absorption layer.

In Fick's law the diffusion coefficient serves for the purpose of calculating the thermally induced transport of a substance on account of the random movement of the particles. The diffusion coefficient can be temperature-dependent and pressure-dependent. According to the Fick's law, the particle flux along a direction due to diffusion is the diffusion coefficient multiplied by the concentration gradient of the particles along this direction.

The transmission rate of a material or a layer is a known measured variable which indicates how many grams per square meter and per day ($g/(m^2 \cdot d)$) pass through the material or the layer.

The diffusion coefficient and the transmission rate depend, for example, on the density of the material and/or the composition of the material. The greater the diffusion coefficient or the transmission rate, the faster the harmful substance diffuses through the material. In the present case, this means that the harmful substance is transported or diffused more quickly through the transport layer than through the absorption layer.

However, the diffusion coefficient and the transmission rate depend not only on the physical and chemical properties of the layer or of the material itself, but also on ambient conditions, such as temperature and pressure. In particular, the concentration gradient of the substance to be transported along the transport direction is decisive for the transmission rate. In order to compare diffusion coefficients or transmission rates of two layers, in the present case, the diffusion coefficients or transmission rates are always specified under the assumption of identical conditions. The transmission rate is specified in a stationary state, for example, when the transmission rate of the harmful substance through the layer no longer changes in time.

In particular, the diffusion coefficient and/or the transmission rate of the transport layer may be greater in the conditions occurring in the component during normal operation, for example, by a factor of at least 2 or at least 5 or at least 10 or at least 50 or at least 100 greater, than the diffusion coefficient or the transmission rate of the absorption layer. The normal conditions are given, for example, by a temperature range of between −40° C. and 105° C. inclusive or between 0° C. and 70° C. inclusive or between 0° C. and 40° C. inclusive, and by means of the usually occurring concentrations of the harmful substance in the component.

The transport layer has, for example, a transmission rate for water and/or oxygen of at least 1 mg/(m²·d) or at least 0.1 g/(m²·d) or at least 1 g/(m²·d) or at least 10 g/(m²·d) or at least 50 g/(m²·d) or at least 100 g/(m²·d). The transmission rate is specified here, for example, at a temperature of 25° C. or 60° C. or 85° C. and a pressure of 1.01325 bar. Furthermore, it is assumed in particular that water and/or oxygen having a negligible concentration is present on one side of the transport layer, whereas a concentration of water and/or oxygen is present directly on the other side of the transport layer, as occurs, for example, in normal ambient air at a relative humidity of 60% or 85% or 90%. In normal ambient air, the oxygen content is approximately 21% by volume.

Under these conditions, the absorption layer has, for example, a transmission rate for water and/or oxygen of at most 1 g/(m²·d) or at most 0.5 g/(m²·d) or at most 0.1 g/(m²·d).

According to at least one embodiment, the absorption layer has a greater storage capacity for the harmful substance than the transport layer. The storage capacity is understood to mean, for example, the specific storage capacity, that is to say the storage capacity normalized to a volume. The storage capacity is specified, for example, in the unit wt. %. This means that at a storage capacity of, for example, 10 wt. %, the layer or the material of the layer can maximally irreversibly absorb so much of the harmful substance that the substance takes up 10 wt. % within the layer. Alternatively, it can also be stated how many mg of the harmful substance can be absorbed per cm³ material of the material to be absorbed.

The storage capacity of a material or of a layer can in turn be dependent on ambient parameters such as the temperature, the pressure or the concentration of the harmful substance in the immediate vicinity of the layer, in the case of water, for example, on the relative humidity. Therefore, in the case of a comparison of the storage capacities of the transport layer and the absorption layer, identical conditions are again assumed when measuring the storage capacity.

In particular, the storage capacity of the absorption layer may be greater at the conditions occurring in the component during normal operation, for example, by a factor of at least 2 or at least 5 or at least 10 or at least 50 or at least 100 greater than the storage capacity of the transport layer. The transport layer preferably has no storage capacity. This means that although the transport layer can absorb and temporarily accommodate the harmful substance, it does not store the harmful substance, but can release it again. In particular, the transport layer is thus designed such that the harmful substance does not react chemically within the transport layer.

For example, the storage capacity of the absorption layer for water and/or oxygen is at least 5 wt. % or at least 8 wt. % or at least 10 wt. % or at least 12 wt. % or at least 14 wt. % or at least 0.1 mg/cm³ or at least 1 mg/cm³ or at least 10 mg/cm³ or at least 50 mg/cm³ or at least 80 mg/cm³, measured at 25° C. or 60° C. or 90° C., 1.01325 bar and 60% or 85% or 90% relative atmospheric humidity or 21% by volume oxygen in the ambient air directly adjacent to the layers.

For example, under these conditions, the transport layer has a storage capacity for the harmful substance of at most 2 wt. % or at most 1 wt. % or at most 0.5 wt. % or at most 0.1 wt. % or at most 0.01 wt. % or at most 10 mg/cm³ or at most 1 mg/cm³ or at most 0.1 mg/cm³ or at most 0.01 mg/cm³.

The direct contact of the absorption layer and the transport layer with the ambient air may only be produced for the determination/measurement of the absolute transmission rates, diffusion coefficients and storage capacities of the materials used for the layers. In a component described here, the absorption layer and/or the transport layer are preferably not in direct contact with the ambient air.

For the organic optoelectronic component, the diffusion coefficients and/or transmission rates and the storage capacities for the harmful substance of the transport layer and of the absorption layer may be adjusted with respect to one another so that the harmful substance is distributed within the transport layer when the transport layer is in contact with the harmful substance, in particular along the lateral extent of the transport layer, above all due to diffusion, and subsequently the harmful substance is non-reversibly absorbed, i.e., stored, by the absorption layer. The harmful substance diffuses in particular from the transport layer into the absorption layer. This is caused in particular by the concentration gradient of the harmful substance between the transport layer and the absorption layer. By virtue of the fact that the absorption layer converts the harmful substance, for example, on account of a chemical reaction, the concentration of the harmful substance in the absorption layer is lower than in the transport layer.

In various embodiments, the component is constructed in such a way that, when the harmful substance penetrates into the component, the majority of the harmful substance reaches the transport layer before it is absorbed by the absorption layer. For this purpose, for example, the absorption layer is surrounded or encapsulated by the transport layer.

Here and below, the lateral extent is understood to mean an extent parallel to a main direction of extent of the active layer or of the organic layer sequence.

The thin-film encapsulation, the absorption layer and the transport layer can each be transmissive or opaque to radiation generated or absorbed by the active layer during intended operation.

In various further embodiments, the thin-film encapsulation, the absorption layer and the transport layer are preferably in each case layers formed from one-piece and/or simply connected layers.

In at least one embodiment, the organic optoelectronic component comprises an organic layer sequence having an active layer for emitting or absorbing electromagnetic radiation. The component further comprises a thin-film encapsulation on the organic layer sequence and an absorption layer on the organic layer sequence, wherein the absorption layer is designed in such a way that it can absorb and store a substance which is harmful to the organic layer sequence. Directly adjacent to the absorption layer is a transport layer for transporting the harmful substance. The transport layer has a greater diffusion coefficient and/or a higher transmission rate for the harmful substance than the absorption layer, whereas the absorption layer has a greater storage capacity for the harmful substance than the transport layer, so that the harmful substance is distributed within the transport layer upon contact with the transport layer and the harmful substance is subsequently absorbed by the absorption layer.

Embodiments of the present invention are based, in particular, on the knowledge that in the case of organic components having a thin-film encapsulation and an absorption layer (getter layer), a harmful substance, such as moisture or oxygen, usually penetrates via the edge region of the component, that is to say via the sides which laterally delimit the component. The harmful substance entering is then largely absorbed and stored by the absorption layer. However, the harmful substance is predominantly stored in this way in the edge region of the component, so that the storage capacity is quickly reached in this region. In the interior of the component, that is to say in the central region, remote from the edge regions, on the other hand, only a little of the harmful substance is stored in the absorption layer. There is therefore the risk that the harmful substance is no longer absorbed in the edge region and passes through the thin-film encapsulation to the organic layer sequence and damages the latter.

In embodiments of the present invention, use is made of a transport layer, which has a higher diffusion coefficient and/or a higher transmission rate for the harmful substance than the absorption layer. The transport layer can transport the harmful substance more quickly from the edge regions into the center of the optoelectronic component. The absorption layer can then absorb and store the harmful substance from the transport layer. In this way, the harmful substance is distributed more evenly over the entire lateral extent of the absorption layer, so that the attainment of a local storage capacity in certain regions of the absorption layer, in particular in edge regions, is delayed or avoided. This reduces the risk of harmful substances reaching the organic layer sequence.

It may be furthermore advantageous that, as a result of the use of the transport layer, the component can already be tested after application of the transport layer, but before the application of the absorption layer. The transport layer preferably already ensures the mechanical stability of the component. For example, the component can then be tested for its moisture stability before the absorption layer is applied. This is usually carried out in wet furnaces, in which the component is heated to about 85° C. at a relative humidity of 95%. Weak points in the thin-film encapsulation would then allow moisture to pass through, which is manifested as dark, non-luminous points in the component. In this way, poor components can already be sorted out. If this quality test were to be carried out only after the absorption layer had been applied, a significant proportion of the storage capacity would already be consumed by the test.

According to at least one embodiment, the transport layer has a thickness of at least 0.1 μm or at least 1 μm or at least 5 μm. Alternatively or additionally, the transport layer is at most 1 mm or at most 100 μm or at most 20 μm or at most 10 μm thick. The thickness of a layer is measured here and subsequently perpendicular to a main direction of extent of the layer.

According to at least one embodiment, the transport layer is in direct mechanical contact with the thin-film encapsulation. For example, the transport layer is applied directly to the thin-film encapsulation and completely covers the thin-film encapsulation.

According to at least one embodiment, the transport layer is arranged between the absorption layer and the thin-film encapsulation. In this case, direct contact between the thin-film encapsulation and the absorption layer can advantageously be prevented by the transport layer. That is to say that the transport layer separates the thin-film encapsulation from the absorption layer at a distance. This allows a more free selection of the materials of the thin-film encapsulation and of the absorption layer, since they do not have to be selected with regard to their mechanical compatibility. Rather, they must only be mechanically compatible with the transport layer, which is easier to implement. In other words, the transport layer decouples the thin-film encapsulation and the absorption layer.

According to at least one embodiment, the transport layer completely covers an active region of the organic layer sequence when viewed in a plan view. The active region is the region of the organic layer sequence in which electromagnetic radiation is absorbed or generated during normal operation.

According to at least one embodiment, the transport layer comprises a polymer, such as an epoxide or an acrylate or a silicone, or consists thereof. The materials of the transport layer are preferably UV-curing or UV-hardened. The transport layer can also comprise or consist of a mixture of these materials. Such materials are suitable in particular for the transport layer if the harmful substance is water/water vapor or oxygen.

For example, a material composition having a density of between 0.7 g/cm$^3$ and 1.1 g/cm$^3$ is selected for the transport layer.

According to at least one embodiment, the absorption layer has a polymer having moisture-absorbing or oxygen-absorbing particles introduced therein. For example, the particles have an alkali or an alkaline earth metal. For example, the particles comprise magnesium, calcium, barium, cesium, cobalt, yttrium, lanthanum and/or metals of the rare earths. In particular, the particles can have metal oxide compounds, such as calcium oxide, barium oxide or magnesium oxide or zirconium oxide.

The absorption layer can be a film-like layer, such as double-sided adhesive tape, pressure-sensitive adhesive, for short PSA. However, the absorption layer can also be applied in a liquid state and subsequently cured. Furthermore, it is possible for the absorption layer to also be liquid in the finished component and, for example, to have a viscosity of at most 102 mPa·s or 104 mPa·s or 10$^6$ mPa·s. In other words, the absorption layer can thus be a solid or a liquid.

The absorption layer has, for example, a thickness of at least 0.1 μm or at least 1 μm or at least 2 μm. Alternatively or additionally, the thickness of the absorption layer is at most 1 mm or at most 100 μm or at most 20 μm or at most 10 μm.

According to at least one embodiment, the absorption layer is surrounded laterally, that is to say in the lateral direction, by an insulation layer. The insulation layer preferably completely surrounds the absorption layer in the lateral direction and delimits the absorption layer in the lateral direction. The insulation layer is preferably a layer having a low transmission rate for the harmful substance. For example, the transmission rate for water and/or oxygen at 25° C. or 60° C. or 90° C., 1.01325 bar and one-sided contact with ambient air at a relative humidity of 60% or 85% or 90% is at most 0.5 g/(m$^2$·d) or at most 0.1 g/(m$^2$·d) or at most 0.01 g/(m$^2$·d) or at most 0.001 g/(m$^2$·d). The insulation layer can be, for example, a polymer layer, in particular an adhesive layer. The insulation layer encapsulates the absorption layer in the lateral direction and is intended to suppress lateral penetration of the harmful substance during normal operation, that is to say a penetration via the edge region of the component. The latter further increases the service life of the component.

The insulation layer can also represent a barrier for the absorption layer, in particular if the absorption layer is liquid. In this case, the insulation layer can already help to prevent the absorption layer from overflowing laterally when the absorption layer is applied.

According to at least one embodiment, in addition to the absorption layer, the transport layer is also laterally surrounded, preferably completely surrounded by the insulation layer. The insulation layer is then, for example, also a lateral boundary or barrier for the transport layer.

According to at least one embodiment, the component comprises a substrate, wherein the organic layer sequence is arranged between the substrate and the thin-film encapsulation. In particular, the organic layer sequence is encapsulated completely by the substrate and the thin-film encapsulation and protected against external influences. In particular, both the organic layer sequence and the electrodes necessary for contacting the organic layer sequence are arranged between the thin-film encapsulation and the substrate.

The substrate can be, for example, a carrier of the component which stabilizes the component and makes it self-supporting. For example, the substrate is a glass substrate or a plastic film or an insulated metal foil. The substrate can be transmissive to radiation generated by the active layer or radiation-opaque.

According to at least one embodiment, the thin-film encapsulation is drawn down to the substrate and is in direct contact with the substrate, for example. In a plan view of the component, the thin-film encapsulation completely covers the organic layer sequence, for example. The plan view is here and in the following a view perpendicular to the main plane of extent of the component or of the organic layer sequence.

According to at least one embodiment, the organic layer sequence is completely encapsulated by the substrate and the thin-film encapsulation, that is to say completely surrounded by the thin-film encapsulation and by the substrate and enclosed by these components.

According to at least one embodiment, the transport layer and/or the absorption layer are drawn laterally over the organic layer sequence. In plan view, for example, the organic layer sequence is partially or completely covered by the transport layer and/or the absorption layer. For example, the organic layer sequence is completely surrounded or encapsulated by the substrate and the absorption layer and/or the transport layer.

For example, in plan view, the active layer, the transport layer, and the absorption layer all overlap with each other in a region, for example, in the entire active region.

According to at least one embodiment, the transport layer completely covers the absorption layer in a plan view of the component. That is to say that the lateral extent of the transport layer is greater than the lateral extent of the absorption layer. In particular, when viewed in a plan view, the absorption layer is completely surrounded by a contiguous web of the transport layer. In this way, the probability is increased that the harmful substance penetrating via the edge region first impinges on the transport layer, is then laterally distributed or diffused within the transport layer and subsequently absorbed by the absorption layer.

According to at least one embodiment, the component further comprises a covering element, wherein the covering element is arranged on a side of the absorption layer which faces away from the organic layer sequence. The covering element can be, for example, a metal foil which is applied to the absorption layer by means of a PSA. For example, the covering element is opaque to radiation. However, the covering element can also be transparent to radiation generated by the active layer. In this case, the covering element is, for example, a glass substrate or a water-impermeable plastic film. The covering element can also be in direct contact with the absorption layer.

According to at least one embodiment, the absorption layer is completely encapsulated by the transport layer, the insulating layer, the thin-film encapsulation and the covering element or surrounded by these elements. For example, each connecting line runs from the absorption layer out of the component either through the transport layer or the insulation layer or the covering element. A harmful substance thus passes from the outside only to the absorption layer, when it passes either the transport layer and/or the insulation layer and/or the covering element. The insulating layer and the covering element already ensure that as little as possible of the harmful substance reaches the absorption layer at all.

BRIEF DESCRIPTION OF THE DRAWINGS

An organic optoelectronic component described here is explained in more detail below on the basis of exemplary embodiments with reference to the drawings. The same reference symbols indicate the same elements in the individual figures. In this case, however, no relationships to scale are illustrated; rather, individual elements can be illustrated with an exaggerated size in order to afford a better understanding.

DETAILED DESCRIPTION OF ILLUSTRATIVE EMBODIMENTS

Figure 1:
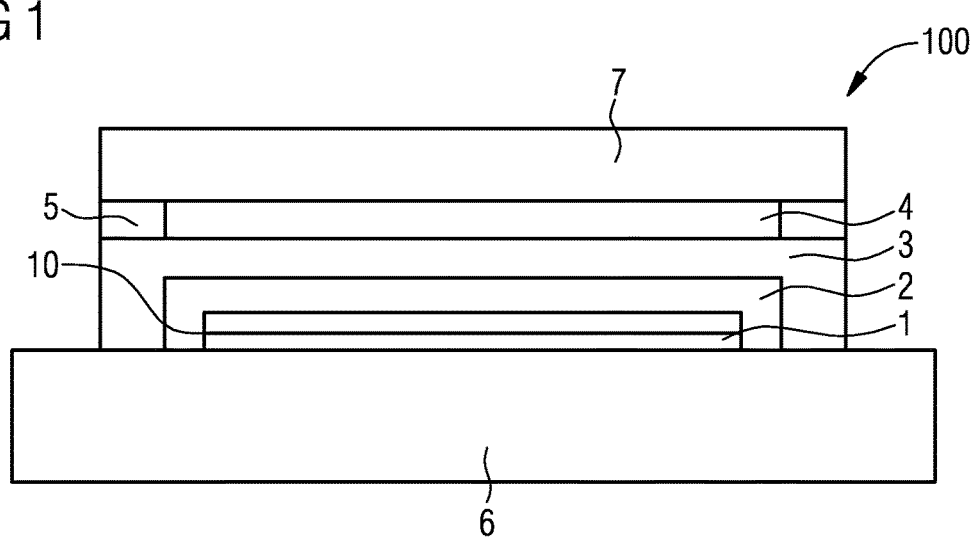
FIGS. 1 to 3 show cross-sectional views of exemplary embodiments of an organic optoelectronic component.

In the exemplary embodiment of FIG. 1, an organic optoelectronic component 100 is shown in a cross-sectional view. The component 100 is in particular an OLED. The component 100 comprises an organic layer sequence 1 having an active layer 10. The organic layer sequence 1 is applied to a substrate 6. Not shown in FIG. 1 is that the organic layer sequence 1 has electrodes both on the side facing the substrate 6 as well on the side facing away from the substrate 6 for electrically contacting the organic layer sequence 1. The substrate 6 is, for example, a glass carrier or a glass substrate, which ensures the mechanical stability of the component 100.

A thin-film encapsulation 2 is applied to a side of the organic layer sequence 1 which faces away from the substrate 6. The thin-film encapsulation 2 is based, for example, on silicon oxide or silicon nitride. The thin-film encapsulation 2 is a layer having a thickness of, for example, between 50 nm and 1 µm inclusive, which extends over the entire side of the organic layer sequence 1 facing away from the substrate 6 and completely covers the latter. The thin-film encapsulation 2 serves to protect the organic layer sequence 1 from harmful substances.

In order to further protect the organic layer sequence 1 from harmful substances, such as water/steam or oxygen, an absorption layer 4 or a getter layer 4 is applied to a side of the organic layer sequence 1 facing away from the substrate 6. The absorption layer 4 is designed to absorb and store the harmful substance in a non-reversible manner. If moisture or oxygen enters into the component 100 via an edge region of the component 100, for example, the moisture or the oxygen is absorbed by the absorption layer 4 and captured by means of a chemical reaction. The absorption layer 4 comprises, for example, a polymer matrix with embedded metal oxide particles.

In order to distribute the harmful substance better over the entire lateral extent of the absorption layer 4, a transport layer 3 is provided between the absorption layer 4 and the thin-film encapsulation 2. The transport layer 3 has in particular a higher diffusion coefficient and/or a higher transmission rate for the harmful substance than the absorption layer 4. After the lateral distribution of the harmful substance along the lateral extent of the component 100, the harmful substance diffuses into the absorption layer 4. Since in this way, no or only a small concentration gradient of the harmful substance occurs in the absorption layer 4, the risk is also reduced that the storage capacity of the absorption layer 4 is reached in the edge region of the absorption layer 4. Furthermore, the transport layer 3 prevents direct contact between the absorption layer 4 and the thin-film encapsulation 2.

The transport layer 3 has, for example, a thickness between 0.1 μm and 20 μm inclusive and comprises a silicone or an acrylate or an epoxide.

In the exemplary embodiment of FIG. 1, the transport layer 3 completely covers the organic layer sequence 1. The absorption layer 4 only partially covers the side of the transport layer 3 facing away from the substrate 6. The absorption layer 4 is completely surrounded by an insulation layer 5 laterally, that is to say in the lateral direction. The insulation layer 5 comprises, for example, a polymer such as an adhesive, and has a low transmission rate of at most 0.1 g/(m²·d).

A covering element 7 is arranged on the side of the transport layer 4 facing away from the substrate 6, which is, for example, a metal foil which is applied by means of an adhesive. The insulation layer 5 all around the absorption layer 4 ensures that only a small amount of the substance harmful to the organic layer sequence penetrates laterally into the component wo and reaches the absorption layer 4.

By virtue of the fact that the absorption layer 4 is completely surrounded or encapsulated by the insulation layer 5, the covering element 7, the thin-film encapsulation 2 and the transport layer 3, it is also possible to form the absorption layer 4 as a liquid layer. For example, the absorption layer 4 is a liquid polymer layer with metal particles or metal oxide particles introduced therein.

Figure 2:
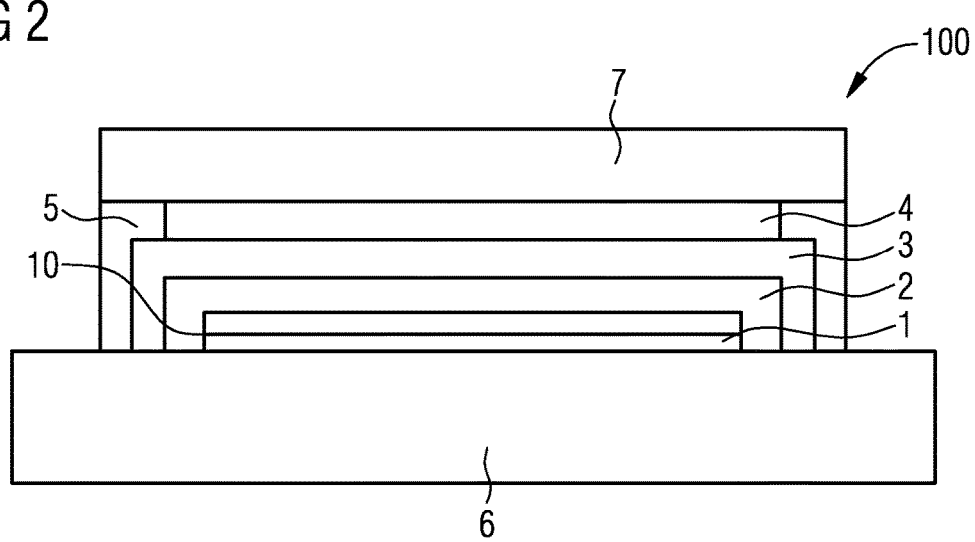

FIG. 2 shows a further exemplary embodiment of an organic optoelectronic component 100. The component of FIG. 2 corresponds essentially to the component of FIG. 1. Unlike in FIG. 1, in addition to the absorption layer 4, the transport layer 3 is also completely surrounded laterally by the insulation layer 5. The insulation layer 5 forms a lateral boundary for the absorption layer 4 and the transport layer 3. In this way, the transport layer 3 is also completely encapsulated by the covering element 7, the insulation layer 5 and the substrate 6, so that the amount of harmful substance which comes into contact with the transport layer 3 is reduced.

Figure 3:
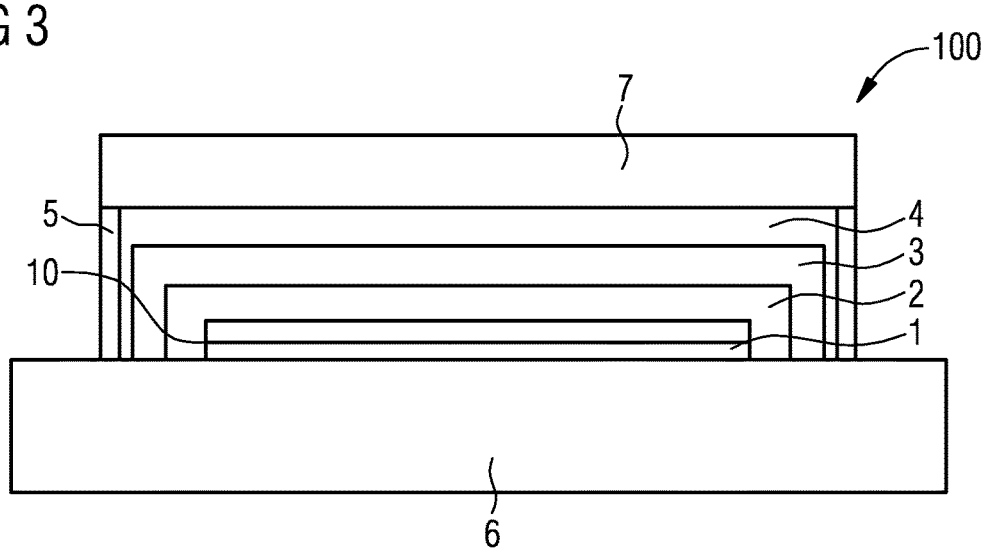

In the exemplary embodiment of FIG. 3, in contrast to the exemplary embodiment of FIG. 2, the absorption layer 4 is not only partially applied to the side of the transport layer 3 facing away from the substrate 6, but completely covers the transport layer 3. In other words, the transport layer 3 is completely covered with the absorption layer 4. The transport layer 3 and the absorption layer 4 are laterally completely surrounded by the insulation layer 5.

Figure 4A:
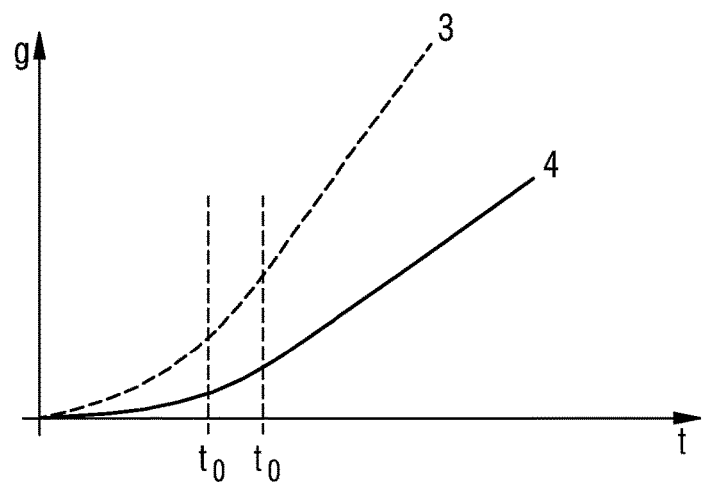
FIGS. 4A and 4B show graphs for the transmission ability and the storage capacity of the transport layer and of the absorption layer.

FIG. 4A shows an exemplary embodiment of the transmission ability for the harmful substance for the transport layer 3 (dashed curve) and for the absorption layer 4 (solid line). The quantity of harmful substance, for example, in grams (g), which passes through one square meter of the layers in each case is on the y-axis. The time (t) is represented on the x-axis. The transmission rate is in each case the time derivative of the curves shown. As can be seen, the transmission ability becomes the shape of a straight line with a constant slope after a certain time ($t_0$). A stationary state therefore develops for both layers, in which the transmission rate assumes a certain value and no longer changes in time. The time $t_0$ which passes until then is different for the two layers and depends on a plurality of factors, such as, for example, the thickness of the respective layer. In the present case, for example, the transmission ability for water vapor at 25° C. and 60% relative air humidity on one side of the layers and 0% relative humidity on the other side of the layers is represented.

Figure 4B:
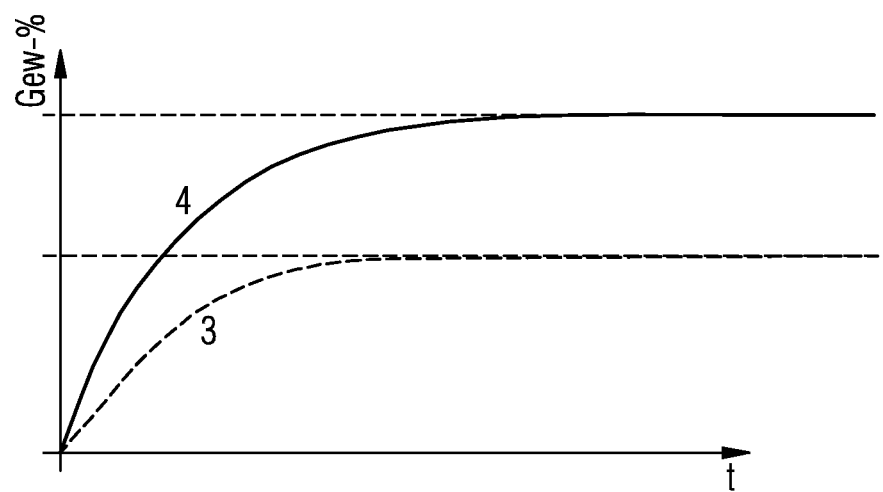

FIG. 4B shows an exemplary embodiment of the absorption ability for the harmful substance for the transport layer 3 (dashed curve) and the absorption layer 4 (solid line). On the y-axis, the mass fraction (wt. %) of the harmful substance in the respective layer is shown. The x-axis again shows the time (t). The absorption rate (wt. %/min) is the time derivative of the respective curves. It can be seen that both curves converge towards a constant value after a certain time. The respective maximum storage capacity of the layers is then reached. In the present case, for example, the absorption ability for water vapor at 25° C. and 60% relative humidity is represented.

The invention described here is not restricted by the description on the basis of the exemplary embodiments. Rather, the invention encompasses any novel feature and any combination of features, which includes in particular any combination of features in the patent claims, even if this feature or this combination itself is not explicitly listed in the patent claims or exemplary embodiments.

What is claimed is:

1. An organic optoelectronic component comprising:
   an organic layer sequence having an active layer for emitting or absorbing electromagnetic radiation;
   a thin-film encapsulation on the organic layer sequence;
   an absorption layer on the organic layer sequence, the absorption layer configured to absorb and store a substance which is harmful to the organic layer sequence; and
   a transport layer directly adjacent to the absorption layer, the transport layer configured to transport the harmful substance,
   wherein the transport layer has a greater diffusion coefficient and/or a higher transmission rate for the harmful substance than the absorption layer, and
   wherein the absorption layer has a higher storage capacity for the harmful substance than the transport layer so that the harmful substance, upon contact with the transport layer, is distributed within the transport layer and is subsequently absorbed by the absorption layer.

2. The component according to claim 1, wherein a storage capacity of the absorption layer is greater by a factor of at least 2 than a storage capacity of the transport layer.

3. The component according to claim 1, wherein the transport layer has a transmission rate for water and/or oxygen of at least 1 g/(m²·d).

4. The component according to claim 1, wherein the absorption layer has a storage capacity for water and/or oxygen of at least 8 wt. %.

5. The component according to claim 1, wherein the transport layer has a thickness of between 0.1 μm and 1 mm inclusive.

6. The component according to claim 1, wherein the transport layer is in direct mechanical contact with the thin-film encapsulation.

7. The component according to claim 1, wherein the transport layer is arranged between the absorption layer and the thin-film encapsulation.

8. The component according to claim 1, wherein the transport layer, viewed in a plan view, completely covers an active region of the organic layer sequence, and wherein the active region is a region of the organic layer sequence in which electromagnetic radiation is absorbed or generated during normal operation.

9. The component according to claim 1, wherein the transport layer comprises an epoxide, an acrylate, a silicone or a mixture thereof, and wherein the absorption layer comprises a polymer having moisture-absorbing and/or oxygen-absorbing particles introduced therein.

10. The component according to claim 1, wherein the absorption layer is laterally surrounded by an insulation layer.

11. The component according to claim 10, wherein the absorption layer is completely encapsulated by the transport layer, the insulation layer, the thin-film encapsulation and a covering element.

12. The component according to claim 10, wherein additionally the transport layer is surrounded laterally by the insulation layer.

13. The component according to claim 1, further comprising a substrate, wherein the organic layer sequence is arranged between the substrate and the thin-film encapsulation.

14. The component according to claim 13, wherein the thin-film encapsulation is drawn down to the substrate.

15. The component according to claim 13, wherein the organic layer sequence is completely encapsulated by the substrate and the thin-film encapsulation.

16. The component according to claim 13, wherein the transport layer and/or the absorption layer are drawn laterally over the organic layer sequence.

17. The component according to claim 1, wherein, in a plan view of the component, the transport layer completely covers the absorption layer.

18. The component according to claim 1, further comprising a covering element, wherein the covering element is arranged on a side of the absorption layer facing away from the organic layer sequence.

19. The component according to claim 18, wherein the absorption layer is completely encapsulated by the transport layer, an insulation layer, the thin-film encapsulation and the covering element.

20. An organic optoelectronic component comprising:
an organic layer sequence having an active layer for emitting or absorbing electromagnetic radiation;
a thin-film encapsulation on the organic layer sequence;
an absorption layer on the organic layer sequence, the absorption layer configured to absorb and store a substance which is harmful to the organic layer sequence; and
a transport layer directly adjacent to the absorption layer, the transport layer configured to transport the harmful substance,
wherein the transport layer has a greater diffusion coefficient and/or a higher transmission rate for the harmful substance than the absorption layer,
wherein the absorption layer has a higher storage capacity for the harmful substance than the transport layer so that the harmful substance, upon contact with the transport layer, is distributed within the transport layer and is subsequently absorbed by the absorption layer, and
wherein, in plan view, the active layer, the transport layer, and the absorption layer all overlap with each other in a region.

* * * * *